United States Patent
Coppone et al.

(10) Patent No.: US 9,570,380 B2
(45) Date of Patent: Feb. 14, 2017

(54) ELECTRONIC DEVICE PROVIDED WITH AN ENCAPSULATION STRUCTURE WITH IMPROVED ELECTRIC ACCESSIBILITY AND METHOD OF MANUFACTURING THE ELECTRONIC DEVICE

(71) Applicant: STMICROELECTRONICS S.R.L., Agrate Brianza (IT)

(72) Inventors: Fabio Vito Coppone, Tremestieri Etneo (IT); Agatino Minotti, Mascalucia (IT); Francesco Salamone, Acireale (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 14/870,721

(22) Filed: Sep. 30, 2015

(65) Prior Publication Data

US 2016/0118320 A1   Apr. 28, 2016

(30) Foreign Application Priority Data

Oct. 24, 2014   (IT) .............................. TO2014A0872

(51) Int. Cl.
*H01L 23/495* (2006.01)
*H01L 23/31* (2006.01)
(Continued)

(52) U.S. Cl.
CPC ....... *H01L 23/49562* (2013.01); *H01L 21/565* (2013.01); *H01L 21/566* (2013.01); *H01L 23/3107* (2013.01); *H01L 23/3114* (2013.01); *H01L 23/49548* (2013.01); *H01L 23/49568* (2013.01); *H01L 24/40* (2013.01); *H01L 24/97* (2013.01); *H01L 23/4952* (2013.01); *H01L 2224/04042* (2013.01);
(Continued)

(58) Field of Classification Search
CPC .......... H01L 23/49562; H01L 23/3107; H01L 23/3114
USPC ........................................ 257/666, 676, 784
See application file for complete search history.

(56) References Cited

U.S. PATENT DOCUMENTS 5,157,475 A * 10/1992 Yamaguchi ............. H01L 21/56
257/679
5,821,615 A 10/1998 Lee
(Continued)

FOREIGN PATENT DOCUMENTS

CN   103400772 A   11/2013
JP   2011-40668 A   2/2011
(Continued)

*Primary Examiner* — Nitin Parekh
(74) *Attorney, Agent, or Firm* — Seed Intellectual Property Law Group LLP (57) ABSTRACT

An electronic device comprising: a semiconductor die integrating an electronic component; a leadframe housing the semiconductor die; a protection body, which surrounds laterally and at the top the semiconductor die and, at least in part, the leadframe structure, defining a top surface, a bottom surface, and a thickness of the electronic device; and a conductive lead electrically coupled to the semiconductor die. The conductive lead is modelled in such a way as to extend throughout the thickness of the protection body for forming a front electrical contact accessible from the top surface of the electronic device, and a rear electrical contact accessible from the bottom surface of the electronic device.

15 Claims, 9 Drawing Sheets

(51) Int. Cl.
*H01L 21/56* (2006.01)
*H01L 23/00* (2006.01)

(52) U.S. Cl.
CPC .......... *H01L 2224/0603* (2013.01); *H01L 2224/32245* (2013.01); *H01L 2224/40245* (2013.01); *H01L 2224/48091* (2013.01); *H01L 2224/48247* (2013.01); *H01L 2224/73265* (2013.01); *H01L 2924/181* (2013.01); *H01L 2924/18301* (2013.01)

(56) References Cited

U.S. PATENT DOCUMENTS

| | | | | |
|---|---|---|---|---|
| 6,040,626 | A * | 3/2000 | Cheah | H01L 23/49562 257/341 |
| 6,630,726 | B1 * | 10/2003 | Crowley | H01L 23/3107 257/666 |
| 6,707,138 | B2 * | 3/2004 | Crowley | H01L 23/49513 257/139 |
| 6,800,932 | B2 * | 10/2004 | Lam | H01L 24/84 257/666 |
| 2004/0080028 | A1 * | 4/2004 | Yanagisawa | H01L 23/3107 257/675 |
| 2007/0052070 | A1 | 3/2007 | Islam et al. | |
| 2007/0182003 | A1 | 8/2007 | Huber | |
| 2008/0157302 | A1 | 7/2008 | Lee et al. | |
| 2009/0001559 | A1 | 1/2009 | Satou et al. | |
| 2009/0179315 | A1 * | 7/2009 | Jereza | H01L 21/565 257/676 |
| 2009/0230519 | A1 * | 9/2009 | Otremba | H01L 23/49524 257/666 |
| 2010/0164078 | A1 * | 7/2010 | Madrid | H01L 23/3107 257/675 |
| 2011/0140252 | A1 | 6/2011 | Camacho et al. | |
| 2011/0198741 | A1 | 8/2011 | Alberghini et al. | |
| 2011/0227207 | A1 * | 9/2011 | Yilmaz | H01L 23/49537 257/676 |
| 2011/0284997 | A1 | 11/2011 | Gong et al. | |

FOREIGN PATENT DOCUMENTS

| | | |
|---|---|---|
| WO | 2011/077781 A1 | 6/2011 |
| WO | 2015/018173 A1 | 2/2015 |

* cited by examiner

ELECTRONIC DEVICE PROVIDED WITH AN ENCAPSULATION STRUCTURE WITH IMPROVED ELECTRIC ACCESSIBILITY AND METHOD OF MANUFACTURING THE ELECTRONIC DEVICE

BACKGROUND

Technical Field

The present disclosure relates to an electronic device provided with an encapsulation structure with improved electric accessibility and to a method of manufacturing the electronic device.

Description of the Related Art

As is known, in the manufacture of semiconductor devices, encapsulation or packaging is the final step that converts a semiconductor substrate into a functional component that may be mounted on a printed circuit board (PCB). Typically, the semiconductor substrate is in the form of a semiconductor die. The package provides a protection for the semiconductor die and provides the necessary electrical connections, through which it is possible to supply signals to the semiconductor die and acquire signals coming from the semiconductor die.

Figure 1:
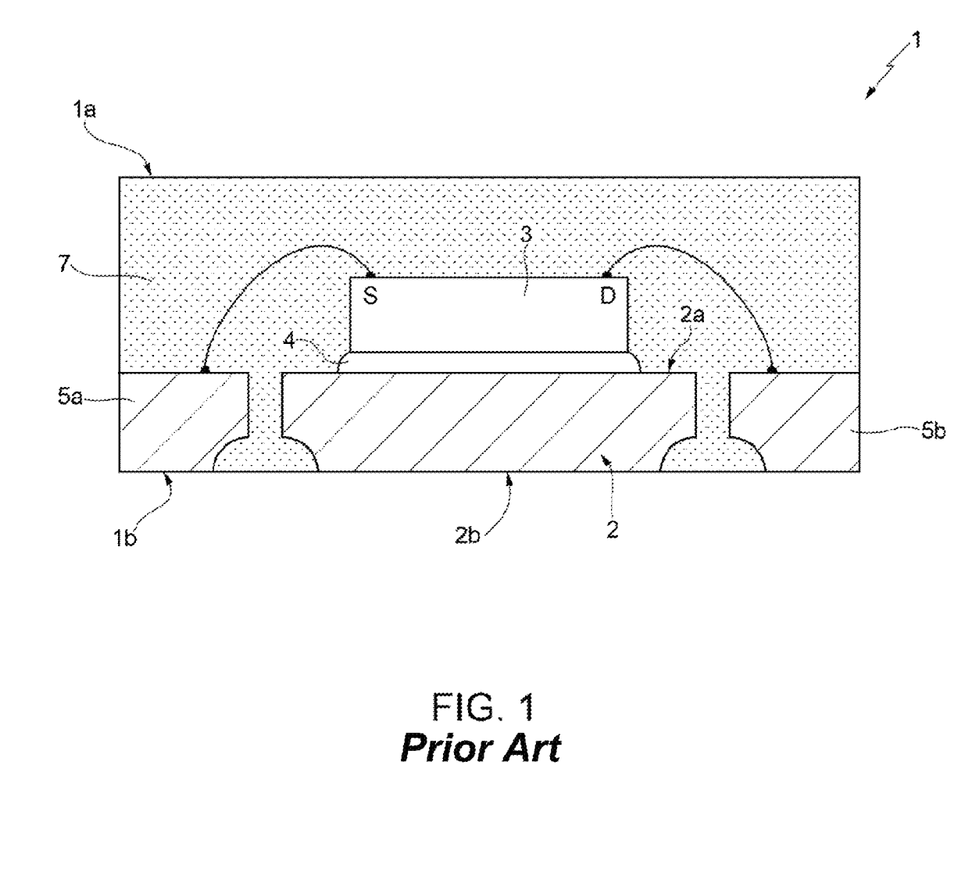
FIG. 1 shows an electronic device provided with a package according to an embodiment of a known type.

To meet the specifications for an increasingly greater integration and reduction in size, the packaging methods currently used include die-level or wafer-level packaging (WLP) and 3D packaging. Further solutions envisage surface-mount devices (SMDs), which enable further reduction in the dimensions of the package and costs of assembly. Consider, for example, the package known as PowerFlat™. This type of package enables minimization of the space occupied by the package itself when mounted on the PCB and at the same time increase of the heat exchange with the PCB itself through the metal connections between the bottom part of the package and the PCB. In fact, as illustrated by way of example in FIG. 1, the electrical connections are obtained by flat regions extending along a bottom surface of the package. With reference to FIG. 1, the package is identified by the reference number 1. A structure 2 that constitutes a support for a die 3 and is designed to provide the electrical connections between the die 3 and the outside of the package 1, is known as a "leadframe" and extends in such a way that a bottom surface region 2b thereof lies in the same plane as a bottom surface 1b of the package 1, thus constituting itself a part of the bottom surface 1b of the package 1. The die 3 is bonded (e.g., by a layer of glue 4) to a top surface region 2a of the leadframe 2. This top surface region 2a has a flat surface expressly dedicated to coupling with the die 3, better known as a "die-attach pad". The top surface region 2a of the leadframe 2 is opposite to the bottom surface region 2b of the leadframe 2.

The leadframe 2 makes available, on the bottom surface region 2b, a plurality of electrical-contact regions 5a, 5b, which are electrically insulated from one another and each of which is designed to transfer a signal from and/or to the PCB. For instance, if the die 3 provides a MOS transistor, the electrical-contact region 5a will be, for example, electrically coupled to the source region S of the MOSFET, whereas the electrical-contact region 5b will be, for example, electrically coupled to the drain region D of the MOS transistor. A further electrical contact (not illustrated) has to be provided, in this example, to form the gate electrical contact.

A layer of resin 7, in particular epoxy resin, extends over the top surface region 2a of the leadframe 2, to cover and protect the die 3, and is designed to protect the top electrical insulation of the leadframe 2 and of the die 3. The resin 7 further extends in perforated areas of the leadframe 2, until it reaches the plane formed by the bottom surface region 2b and thus completes formation of the bottom surface 1b of the package 1.

Since the electrical-contact regions 5a, 5b both extend in the bottom surface 1b of the package 1, electrical coupling with the PCB (not illustrated herein) is obtained at the bottom surface 1b of the package 1. In general, the entire bottom surface region 2b of the leadframe 2 is designed to be set facing the PCB, and thus it likewise provides a surface for heat exchange between the package 1 and the PCB.

Current packages, and in particular the package described with reference to FIG. 1, present certain disadvantages. In particular, for power applications the heat exchange that is obtained with the PCB may not be sufficient to protect a good cooling of the die 3. Furthermore, the operations for testing the package 1 prove complex and costly, in so far as they may be carried out by providing a PCB dedicated to the testing procedure, to which the package 1 is to be coupled by bonding of the bottom surface 1b.

BRIEF SUMMARY

One or more embodiments of the present disclosure is directed to an electronic device and a method of manufacturing the electronic device. One embodiment is an electric device that overcomes one or more aspects of the prior art and extends the functions thereof.

In one embodiment, there is proposed an electric device including a semiconductor die integrating an electronic component. The semiconductor die has a front side and a rear side that is opposite to the front side. The front side has a first access region that provides electric access to the electronic component of the semiconductor die. The electric device further includes a leadframe structure having a supporting region that supports the semiconductor die. The rear side of the semiconductor die is coupled to the supporting region. The electric device further includes a protection body that laterally surrounds the semiconductor die and is over the first region of the semiconductor die. The protection body is, at least in part, over the leadframe structure. The protection body has a top surface, a bottom surface, and a thickness. The electric device further includes a first conductive lead electrically coupled to the first access region. The first conductive lead extends through the thickness of said protection body and forms a front electrical contact accessible at the top surface and a rear electrical contact accessible at the bottom surface.

BRIEF DESCRIPTION OF THE SEVERAL VIEWS OF THE DRAWINGS

For a better understanding of the present disclosure, a preferred embodiment, provided purely by way of non-limiting example, is now described with reference to the annexed drawings, wherein.

DETAILED DESCRIPTION

Figures 2A, 2B:
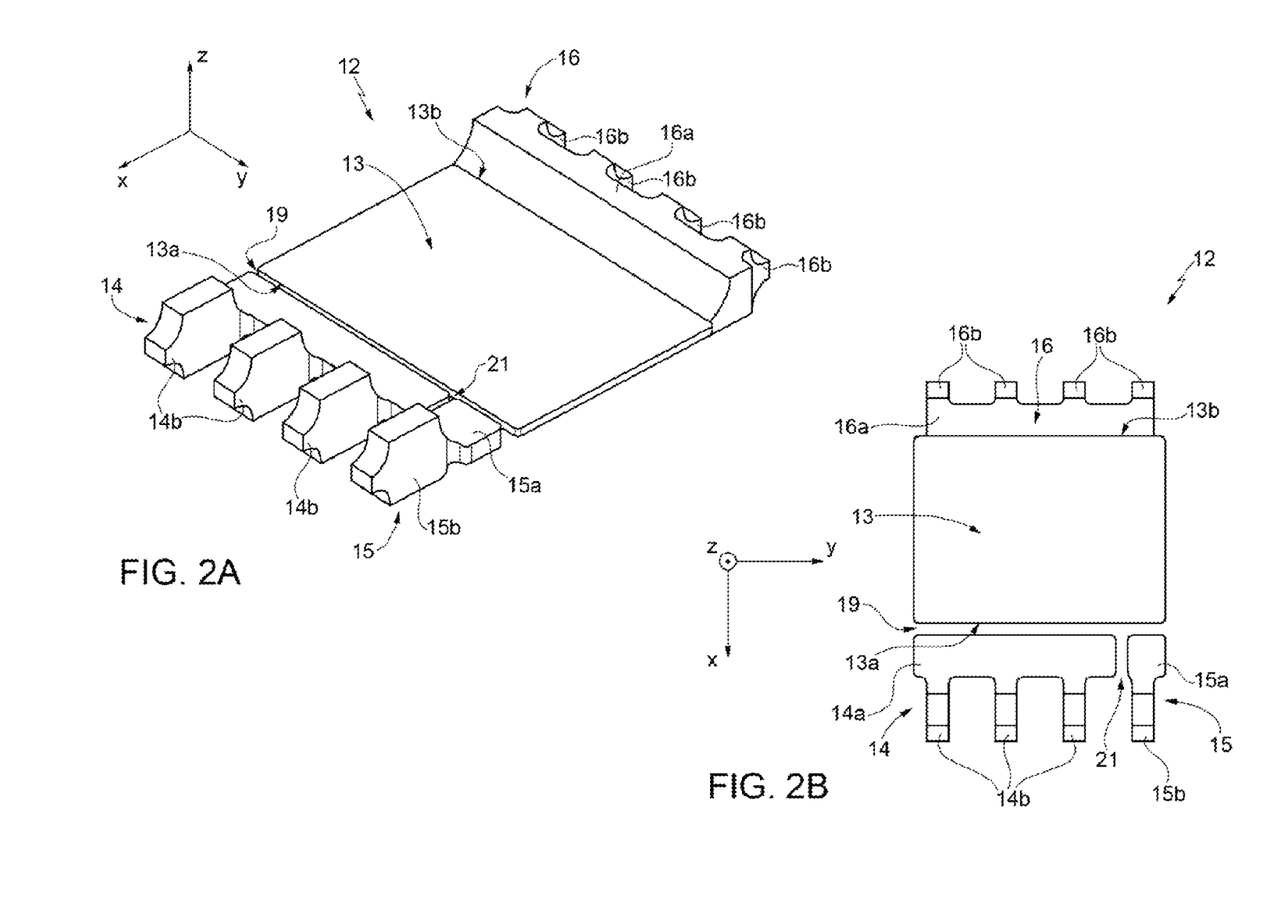
FIGS. 2A and 2B show a leadframe structure in perspective view and in top view, respectively, according to one aspect of the present disclosure.

With reference to FIG. 2A, represented in perspective view is a structure 12 designed to carry a die (i.e., to provide a mechanical support therefor) and designed to provide part of the electrical connections between the die and the outside of the package 1. The structure 12 is known as a "leadframe". FIG. 2B shows the leadframe 12 of FIG. 2A in top view.

With reference to both of FIGS. 2A and 2B, the leadframe 12 comprises a central region 13, having a substantially flat exposed surface 12a, which is designed to receive the die and is referred to as a "die pad" or "die-attach pad". Extending opposite to the surface 12a is a rear surface 12b of the leadframe 12, which is substantially flat and is designed to form a resting or coupling base of the leadframe 12 with a portion of a PCB (not illustrated).

A plurality of "leads" 14, 15 extends electrically uncoupled from the central region 13, whereas leads 16 extend mechanically and electrically coupled to the central region 13 (in particular, they are made of a single piece with the central region 13).

In greater detail, the central region 13 of the leadframe 12 has a substantially quadrangular shape and extends in a plane XY with thickness, measured along an axis Z orthogonal to the plane XY, comprised approximately between 100 µm and 300 µm, in particular approximately 200 µm. The central region 13 of the leadframe 12, according to one embodiment, extends along X for a distance comprised between 3 and 6 mm (e.g., 3.22 mm) and along Y for a distance comprised between 4 and 5 mm (e.g., 4.61 mm). The dimensions of the central region 13 may vary with respect to what is indicated and are chosen according to the size of the die that it has to house.

The leads 14 and 15 extend facing a side 13a (extending along Y) of the central region 13. Each lead 14 and 15 has a main direction of extension in the positive direction of the axis X, and is mechanically and electrically separated from the central region 13 by a trench 19. The lead 14 includes a supporting portion 14a, directly facing the trench 19, and a plurality of projecting elements 14b, which are mechanically and electrically coupled to the supporting portion 14a, extending from the supporting portion 14a in cantilever fashion, along X, to form fingers 14b. The supporting portion 14a extends along X for approximately 1-2 mm.

The lead 15 is similar to the lead 14, and includes a supporting portion 15a, directly facing the trench 19, and just one projecting element 15b that extends, mechanically and electrically coupled to the supporting portion 15a, in cantilever fashion along X starting from the supporting portion 15a, to form a finger 15b. The lead 15 is mechanically and electrically separated from the lead 14 by a further trench 21. The supporting portion 15a extends along X for approximately 1-2 mm, like the supporting portion 14a.

Each finger 14b, 15b is designed for having a thickness along Y comprised approximately between 200 and 400 µm, for example approximately 350 µm, and a thickness along Z comprised approximately between 0.5 mm and 1.5 mm, for example approximately 0.8 mm. In particular, the thickness along Z of the fingers 14b and 15b is substantially equal to the thickness that is desired or envisaged for the package that houses the leadframe 12 at the end of the manufacturing steps.

Each finger 14b, 15b faces, along Y, another finger 14b, 15b and is separated therefrom by a distance, along Y, of approximately 1 mm. Illustrated in FIG. 2A and in FIG. 2B are three fingers 14b and just one finger 15b. However, it is possible to provide fingers 14b, 15b in any desired number starting from one.

The lead 16 extends from a side 13b, opposite to the side 13a in the direction X, of the central region 13, mechanically and electrically in contact with the central region 13, and proceeds in the negative direction of the axis X. The lead 16, according to the embodiment of FIG. 2, extends along the axis Y throughout the length of the side 13b. However, it is evident that variants may be envisaged. For instance, the lead 16 may extend along Y for a distance shorter than the length of the side 13b. Alternatively, it is possible to provide leads of the same type as the leads 14 and/or 15 also in the region corresponding to the side 13b. Furthermore, the lead 16 has a thickness, along the axis Z, equal to the thickness of the leads 14, 15.

The lead 16 includes a supporting portion 16a, directly coupled to the central portion 13, and a plurality of fingers 16b that branch off from the supporting portion 16a in cantilever fashion along the axis X.

Figure 3:
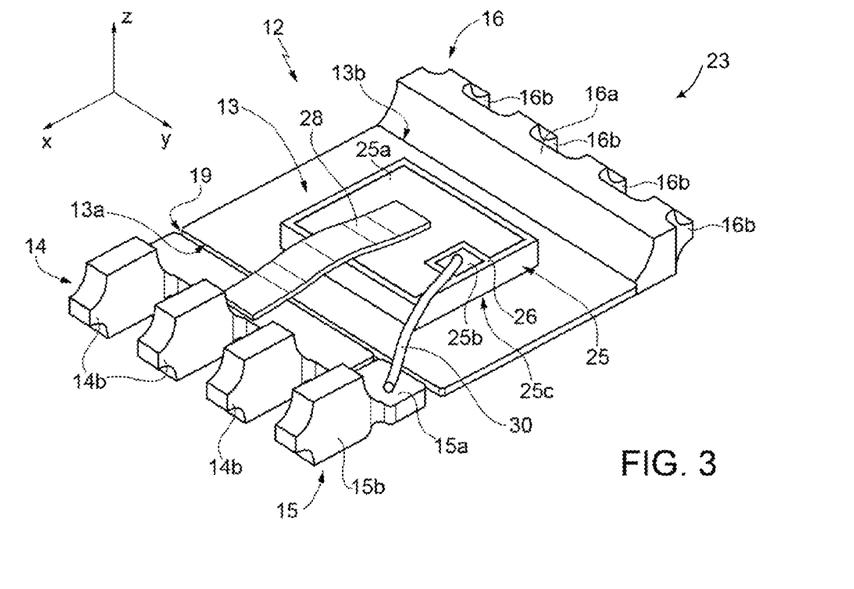
FIG. 3 shows the structure of an electronic device in an intermediate manufacturing step, including the leadframe structure of FIG. 2A that houses a semiconductor die.

FIG. 3 shows an intermediate packaging structure 23 including the leadframe 12 of FIGS. 2A and 2B and a die 25 housed in the central region 13 of the leadframe 12. The die 25 is of a previously machined type and implements, for example, a MOS transistor. For this purpose, the die 25 makes available external metal contacts, namely: a source contact 25a; a gate contact 25b, electrically insulated from the source contact 25a by an insulation region 26; and a drain contact 25c extending on the back of the die 25 and in electrical contact with the central region 13 of the leadframe 12. The source contact 25a, gate contact 25b, and drain contact 25c are of metal material, for example aluminum or copper or a metal alloy including aluminum or copper, or other metals still, in a per se known manner.

The source region 25a is electrically coupled to the supporting portion 14a of the lead 14 by conductive element, such as a conductive ribbon 28, for example a metal ribbon, such as aluminum. A conductive ribbon 28 is preferable to a conductive wire in power applications. It is evident that alternatives to what is illustrated in the figures are possible. The gate region 25b is electrically coupled to the supporting portion 15a of the lead 15 by a conductive wire 30. The drain terminal of the transistor integrated in the die 25 is coupled to the central portion 13 of the leadframe 12 by a metal bonding contact or a layer of conductive glue, formed in a per se known manner. Since the lead 16 is in direct electrical contact with the central portion 13 of the leadframe 12, the lead 16 is in electrical connection with the drain terminal of the transistor integrated in the die 25.

Figure 4:
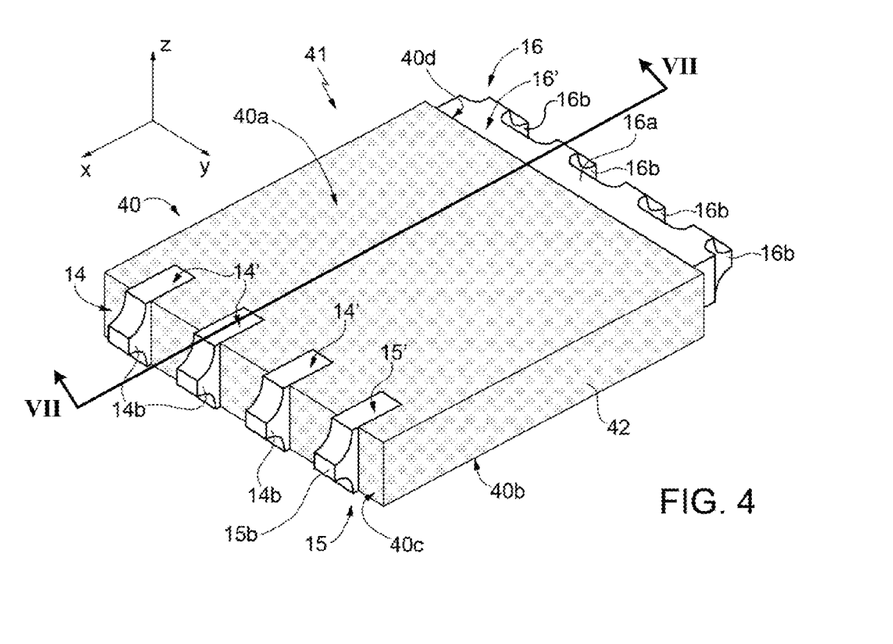
FIG. 4 shows the electronic device of FIG. 3 at the end of the molding steps, provided with a package according to one aspect of the present disclosure.

FIG. 4 shows an electronic device 41 provided with a package 40 that encapsulates the die 25 and part of the leadframe 12 of FIG. 3. The electronic device 41 is obtained by subjecting the leadframe 12 and the die 25 of FIG. 3 to a molding step, covering completely, by a polymeric layer 42 (typically, an epoxy resin), the central portion 13 of the leadframe, the supporting portions 14a, 15a of the leads 14, 15, the die 25, and the electrical connections 28, 30. Also the trenches 19 and 21 are filled with the polymeric layer 42. The leads 14, 15, and 16 are not completely covered by the polymeric layer 42, and project outside the package 40 enabling electric access from the outside of the package 40 itself.

The package 40 comprises a top side 40a, lying in a plane parallel to the plane XY, and a bottom side 40b, opposite to the top side 40a in the direction Z and lying in a respective plane parallel to the plane XY. The package 40 further comprises lateral surfaces, in particular a lateral surface 40c, which lies in a plane parallel to the plane YZ, and a lateral surface 40d, which is opposite to the lateral surface 40c along X and lies in a respective plane parallel to the plane YZ.

As may be noted from FIG. 4, top surface portions 14', 15', and 16' of the fingers 14b, 15b and, respectively, 16b are not covered by the polymeric layer 42 and lie substantially in the same plane as the top side 40a of the package 40. Similar bottom surface portions (not illustrated in the figures) of the fingers 14b, 15b, 16b are available on the bottom side 40b of the package 40.

Furthermore, the leads 14 and 15 are accessible from the lateral surface 40c of the package 40 (by accessing the lateral projections of the fingers 14b, 15b), and also the lead 16 is accessible from the lateral surface 40d, opposite to the side 40c, of the package 40 (by accessing the lateral projections of the fingers 16b).

The molding step for completing formation of the package 40 is carried out following a process of film-assisted molding (FAM), made available by Boschman Technologies. The film-assisted molding process enables packaging of ultra-thin semiconductor components on one or more surfaces thereof.

Figure 5A:
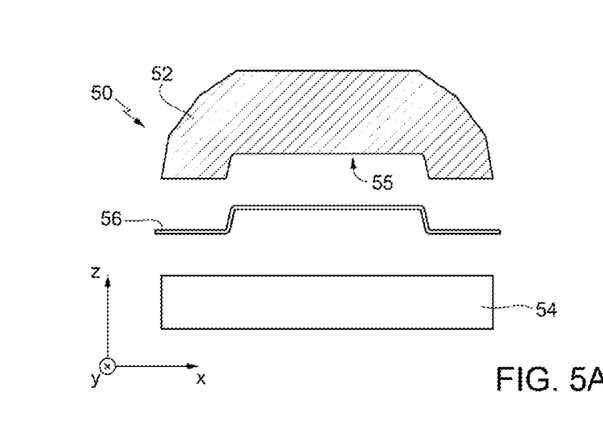
FIGS. 5A-5E show molding steps for obtaining the electronic device of FIG. 4.

With reference to FIG. 5A, the film-assisted molding process envisages use of a packaging system 50 including a first mold 52 and a second mold 54. The second mold 54 is designed to support the leadframe 12 (as in the case of FIG. 3) on the back of the leadframe 12 (here, the back of the leadframe 12 is defined as the surface of the leadframe 12 opposite to the surface of the region 13 in the area where the die 25 rests). The first mold is shaped in such a way as to house the top surface of the leadframe 12 (in particular, the leads 14-16), together with the die 25 and the electrical connections formed by the ribbon 28 and by the conductive wire 30.

The first mold 52 comprises, for this purpose, a cavity 55 defining at least in part the final shape of the polymeric layer 42 at the end of the molding steps. The second mold 54 has, in this example, a flat resting surface.

Figure 5B:
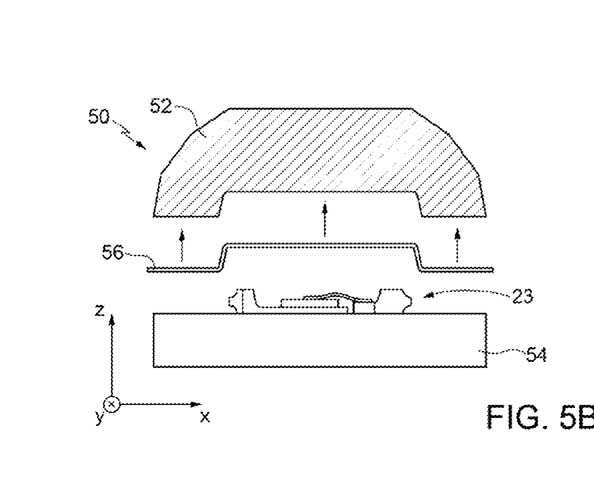
Figure 5C:
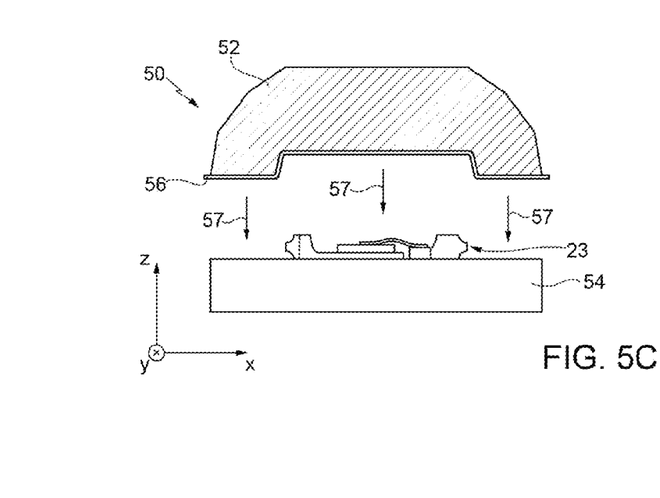

The encapsulation system 50 further envisages use of a molding film 56 designed to follow the shape of the cavity 55 of the first mold 52, as is illustrated more clearly with reference to FIGS. 5B and 5C. For this purpose, the molding film 56 may consist of a modelable material that is designed to adhere to the walls of the cavity 55 or else may be pre-formed and pre-modelled for getting them to assume the same shape as the cavity 55.

Figure 5D:
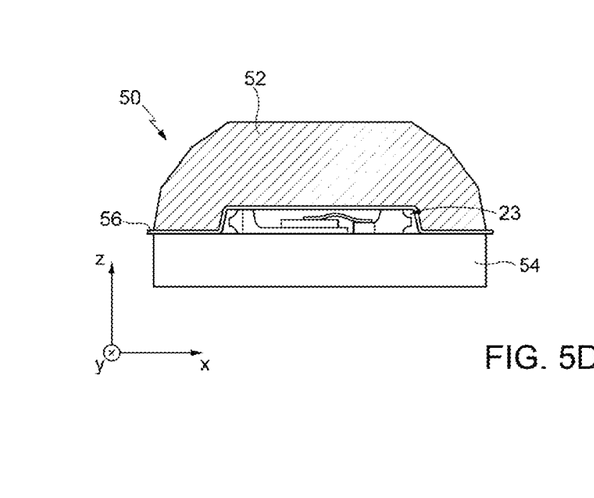

The first mold 52, the molding film 56, and the cavity 55 are sized and/or modelled in such a way that the top surface 14', 15', and 16' of the fingers 14b, 15b, and 16b of the leads 14, 15, and 16 is in direct contact with the molding film 56 when the first mold is set in contact with the second mold, as indicated by the arrows 57 of FIG. 5C. FIG. 5D shows the first and second molds in contact with one another through the molding film 56. More in particular, during the step of FIG. 5D, the top surface 14', 15', and 16' of the fingers 14b, 15b, and 16b is partially embedded in the molding film 56 to be protected during a subsequent molding step. In other words, the molding film 56 is locally pressed by the top surface 14', 15', and 16' of the fingers 14b, 15b, and 16b.

Figure 5E:
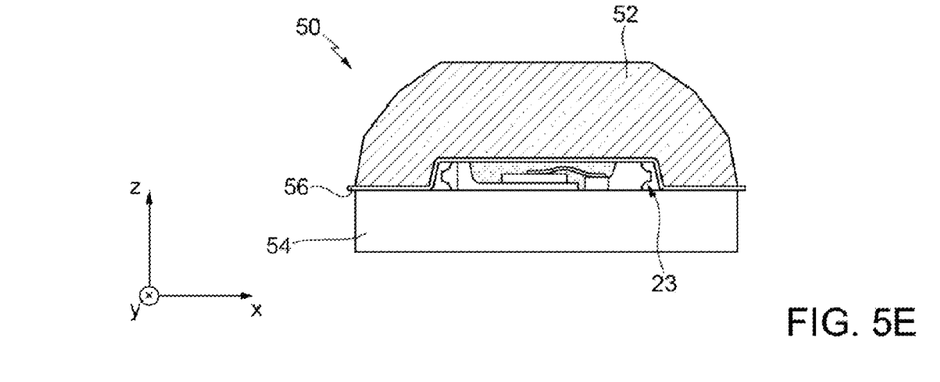

FIG. 5E shows the molding step in which a polymeric material, more in particular a thermosetting polymer or resin, is injected into the cavity 55 to form the polymeric layer 42, in particular on top of the die 25 and of the electrical contacts 28 and 30. The portions of the leads 14-16 protected by the molding film 56 are not covered by the polymeric material. Also the bottom surface portion of the leadframe 12, in contact with the second mold 54, is not covered by the polymeric material.

Steps of curing of the polymeric material are carried out to favor hardening thereof. In the case of a thermosetting material, a step of heating to a temperature that depends upon the type of material used is carried out. For instance, in the case of epoxy resin, a step of baking in an oven is carried out at 175° C. for 8 h.

Then, an optional step of cleaning of the package (de-flashing step) is carried out for removing any possible residue of polymerized material from above the regions of the leadframe 12 that should remain exposed for access from outside.

Figure 6:
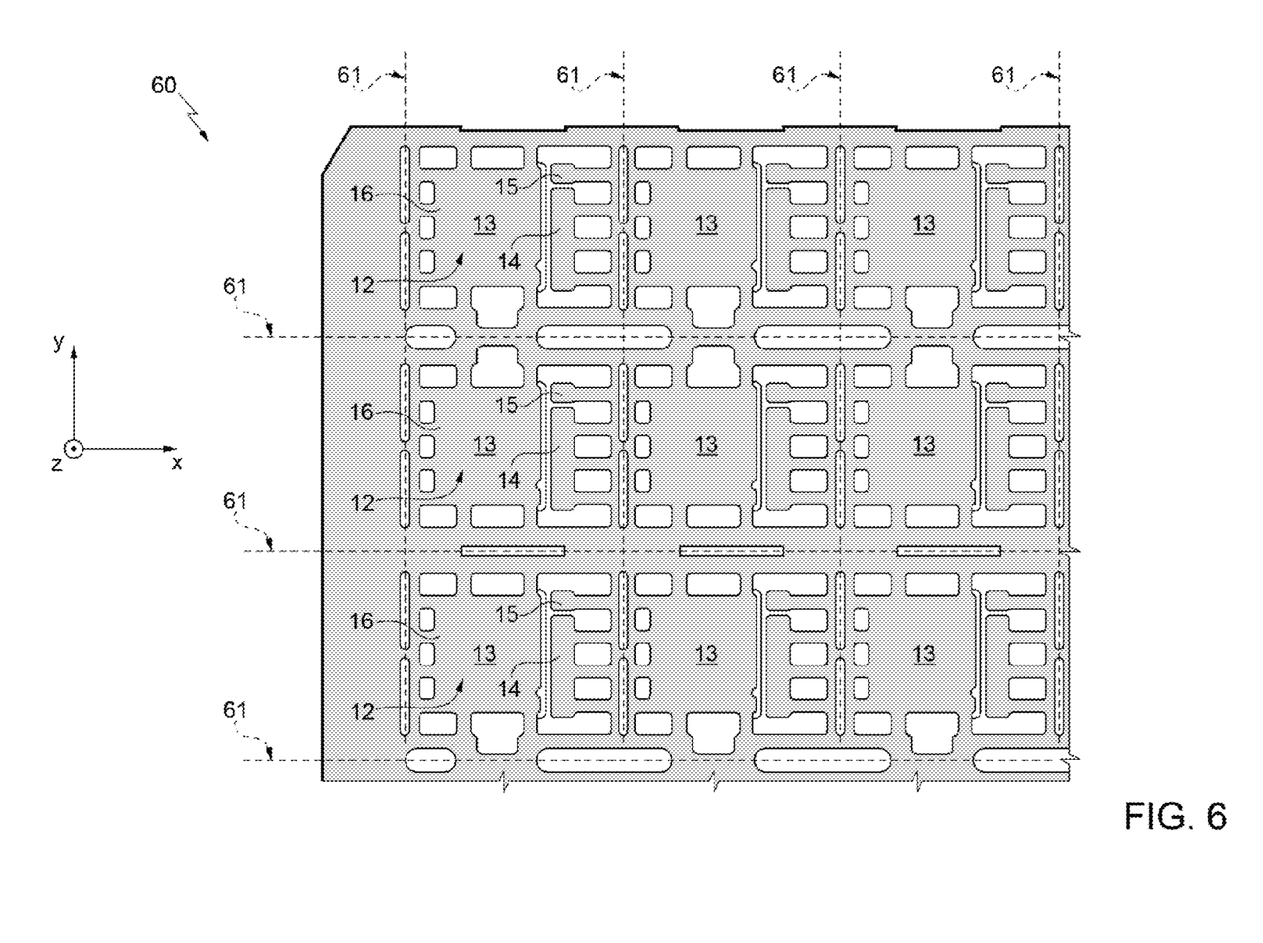
FIG. 6 shows, in top view, an array 60 of leadframes of FIG. 2B, prior to a step of singulation of the leadframes.

The molding steps of FIGS. 5A-5E have been illustrated and described with reference to just one leadframe housing just one die, for simplicity of representation. However, the molding operations are typically carried out on an array of leadframes 12 mechanically joined together of the type illustrated by way of example (in top view) in FIG. 6. FIG. 6 shows, in top view, an array 60 of leadframes in which, for simplicity of representation, the dice 25 and the electrical connections 28, 30 have been omitted.

After the steps of molding and hardening of the polymeric material, each leadframe 12 is separated from the leadframes 12 adjacent thereto by carrying out a cutting step (in a per se known manner) in cutting regions 61. In this way, each package 40 is separated from the other packages 40.

Figure 7:
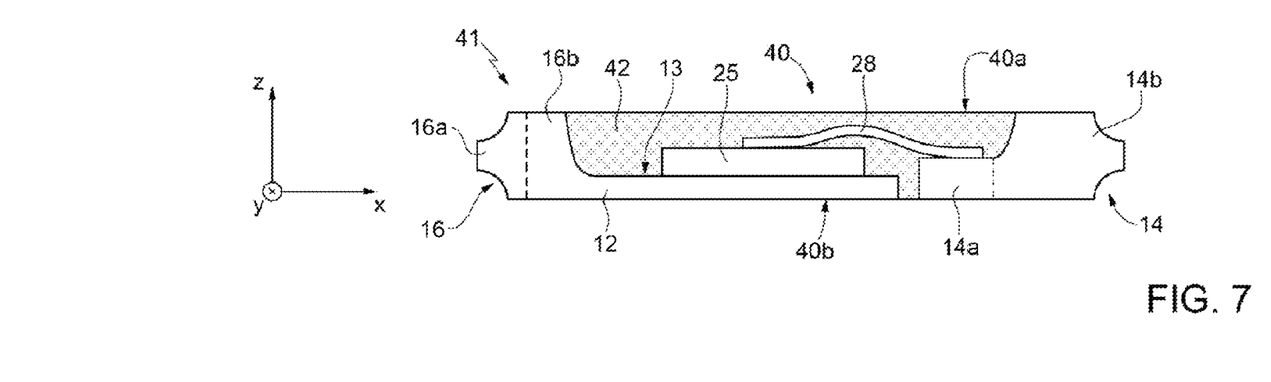
FIG. 7 shows a cross-sectional view of the electronic device of FIG. 4, taken along the line of section VII-VII.

FIG. 7 shows a lateral sectional view of the package 40 of FIG. 4, taken along the line of section VII-VII, and obtained after the step of FIG. 5E.

As may be noted from FIG. 7, the bottom side 40b of the package 40 is electrically accessible by contacting the exposed portions of the back of the leadframe 12, i.e., the surface of the leadframe 12 that is opposite, along the axis Z, to the central region 13 on which the die 25 rests and which represents the drain contact of the die 25 itself. Also the top side 40a of the package 40 is electrically accessible by contacting the exposed portions of the front of the leadframe 12.

Figure 8:
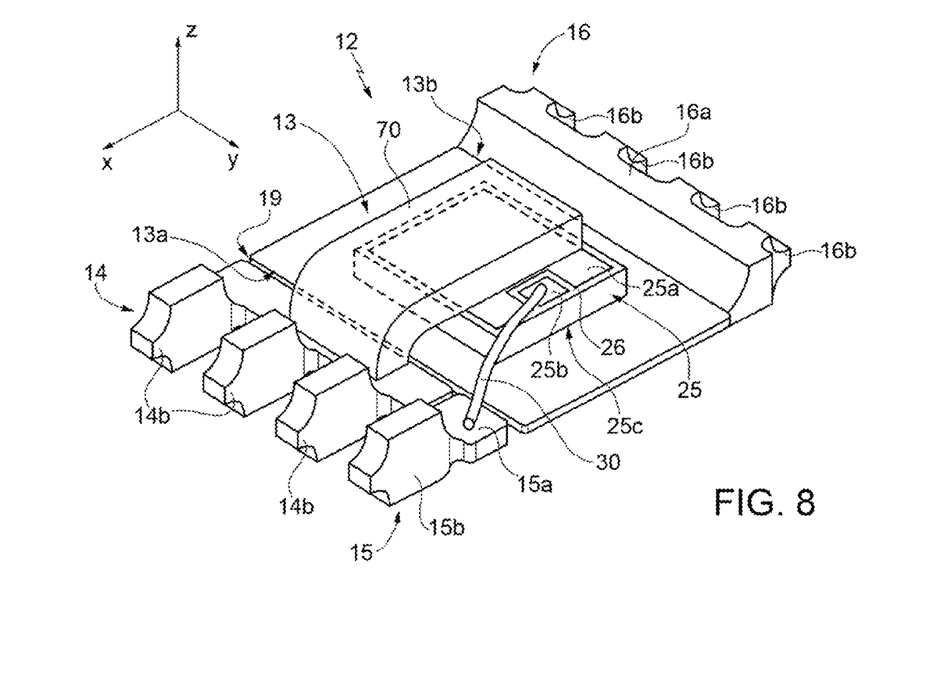
FIG. 8 shows the structure of an electronic device in an intermediate manufacturing step, according to an embodiment alternative to that of FIG. 3.

FIG. 8 shows a further embodiment of the present disclosure. In this case, after setting in place a leadframe 12 provided with leads 14-16 of the type illustrated in FIG. 2, and already described with reference to this figure, there follows a step of coupling of the die 25 in the central region 13 of the leadframe 12, as has already been described with reference to FIG. 3.

According to the embodiment of FIG. 8, this is followed by a further step of coupling of a conductive sheet 70, for example of metal (in particular, copper), on top of the die 25, in electrical contact with the source metallization 25a, but not with the gate metallization 25b. The conductive sheet 70 extends until it reaches and electrically contacts the supporting portion 14a of the lead 14, thus replacing the ribbon 28 illustrated in FIG. 3. The gate metallization 25b is instead electrically coupled to the supporting portion 15a of the lead 15 by the conductive wire 30 already described previously. The conductive sheet 70 is mechanically coupled to the source metallization 25a by means, for example, of a layer of conductive glue. Other embodiments are possible, for instance a metal bonding, or others still.

The conductive sheet 70 is chosen of a thickness such that, following upon the step of mechanical coupling with the die 25, it reaches a maximum height, measured in the positive direction of the axis Z, substantially equal to the maximum height reached, in the positive direction of the axis Z, by the leads 14, 15, and 16. In other words, the top surface 70' of the conductive sheet 70 is substantially coplanar to the respective top surfaces 14', 15', and 16' of the leads 14, 15, and 16. Possible variations of height reached along Z by the conductive sheet 70 with respect to the desired one, may be put down, for example, to production spread.

For instance, according to one embodiment, the leadframe 12, in the central region 13, has a thickness, along Z, of approximately 200 µm±10 µm, the layer of coupling between the central region 13 and the die 25 (e.g., solder bumps or conductive glue) has a thickness, along Z, of approximately 40 µm±10 µm, the die 25 has a thickness, along Z, of approximately 200 µm±10 µm, a further coupling layer between the source metallization 25a of the die 25 (e.g., solder bumps or conductive glue) and the conductive sheet 70 has a thickness, along Z, of approximately 40 µm±10 µm, and finally, the conductive sheet 70 is chosen as having a thickness such as to reach the maximum height, along Z, reached by the leads 14-16. For instance, considering leads 14-16 all having the same thickness, equal to 0.8 µm, the conductive sheet 70 is chosen with a thickness of 240 µm.

In this way, an intermediate leadframe structure 73 is obtained that follows the same molding process as the one already described with reference to the intermediate leadframe structure 23, according to the steps of FIGS. 5A-5E. The same considerations made with reference to FIG. 6 likewise apply here. A possible difference between the maximum height reached by the conductive sheet 70 as compared to the maximum height reached by the leads 14-16 is caused by manufacturing spread, considering the tolerances previously indicated. In any case, since during the molding step the conductive sheet 70 and the leads 14-16 are pressed against the molding film 56, partially sinking into it, the possible variation of a thickness due to the manufacturing spread is compensated, and both the top surface 70' of the conductive sheet 70 and the top surfaces 14'-16' of the leads 14-16 are protected during the molding step and are not covered by the polymeric layer.

Figure 9:
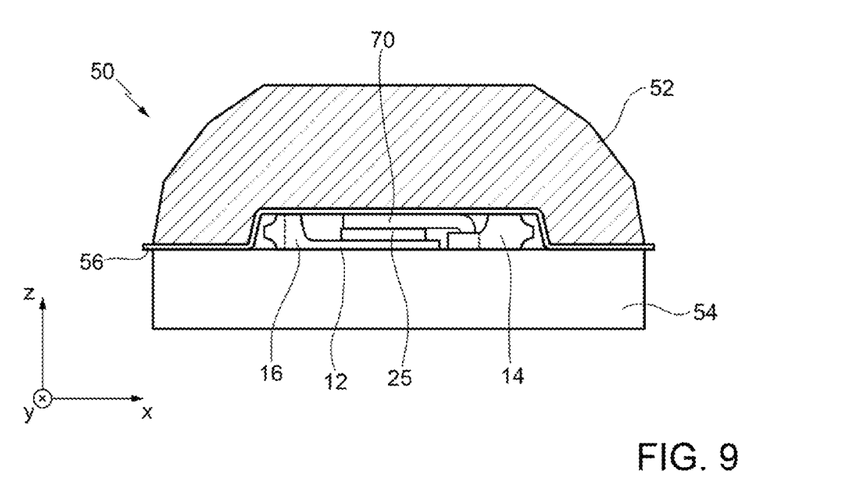
FIG. 9 shows a step of molding of the intermediate structure of FIG. 8, alternative to the molding step of FIG. 5D.

FIG. 9 illustrates the molding step of FIG. 5D in the case of the intermediate leadframe structure 73. It is pointed out that, in the case of FIG. 9, also the conductive sheet 70 is in direct contact, in its top surface 70', with the molding film 56. More in particular, during the step of FIG. 9, both the top surface 14', 15', and 16' of the fingers 14b, 15b, and 16b and the top surface 70' of the conductive sheet 70 are partially embedded in the molding film 56 to be protected during the subsequent molding step (of the type according to FIG. 5E). In other words, the molding film 56 is locally pressed by the top surface 14', 15', and 16' of the fingers 14b, 15b, and 16b and by the top surface 70' of the conductive sheet 70.

Figure 10A:
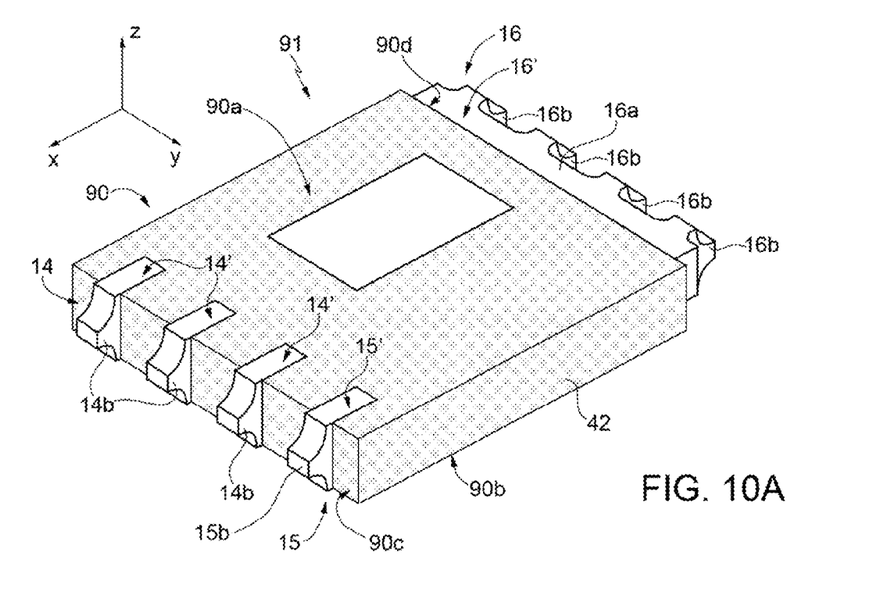
FIGS. 10A and 10B show respective views of the electronic device of FIG. 8 at the end of the molding steps, which is provided with a package according to a further aspect of the present disclosure.

FIG. 10A shows an electronic device 91 provided with a package 90 that encapsulates the intermediate leadframe structure 73 of FIG. 8, after the molding step of FIG. 9. The electronic device 91 is obtained by completely covering, by a polymeric layer 92 (having the same characteristics as those already described with reference to the polymeric layer 42), the central portion 13 of the leadframe 12, the supporting portions 14a, 15a of the leads 14, 15, the die 25, and the conductive wire 30. Also the trenches 19 and 21 are filled with the polymeric layer 92.

The package 90 comprises a top side 90a, lying in a plane parallel to the plane XY, and a bottom side 90b, which is opposite to the top side 90a in the direction Z and lies in a respective plane parallel to the plane XY. The package 90 further comprises lateral surfaces, in particular a lateral surface 90c, lying in a plane parallel to the plane YZ, and a lateral surface 90d, which is opposite to the lateral surface 90c along X and lies in a respective plane parallel to the plane YZ.

As regards the conductive sheet 70, it is noted that it is not completely covered by the polymeric layer 92. In particular, the top surface 70' of the conductive sheet 70 is exposed towards the outside of the package 90 in the region corresponding to the top side 90a and is electrically accessible. The portions of the sheet 70 extending to a height, along Z, lower than the height of the top surface 70' are, instead, covered by the polymeric layer 92 (except, possibly, for the portion of the sheet 70 embedded in the molding film during the step of FIG. 9).

Also the leads 14, 15, and 16 are not completely covered by the polymeric layer 92, and project outside the package 90 enabling electric access thereto from the outside of the package 90, both on the top side 90a and on the bottom side 90b, or else laterally, on the lateral surface 90c (leads 14, 15) and the lateral surface 90d (lead 16). As may be noted from FIG. 9, the top surface portions 14', 15', and 16' of the fingers 14b, 15b, and 16b, respectively, are not covered by the polymeric layer 92 and lie substantially in the same plane as the top side 90a of the package 90, coplanar to the exposed surface 70' of the conductive sheet 70.

For completeness of exposition, it may be noted that the leads 14 and 15 are further accessible from the lateral surface 90c of the package 90, and also the lead 16 is accessible from the lateral surface 90d, opposite to the side 90c, of the package 90.

Figure 10B:
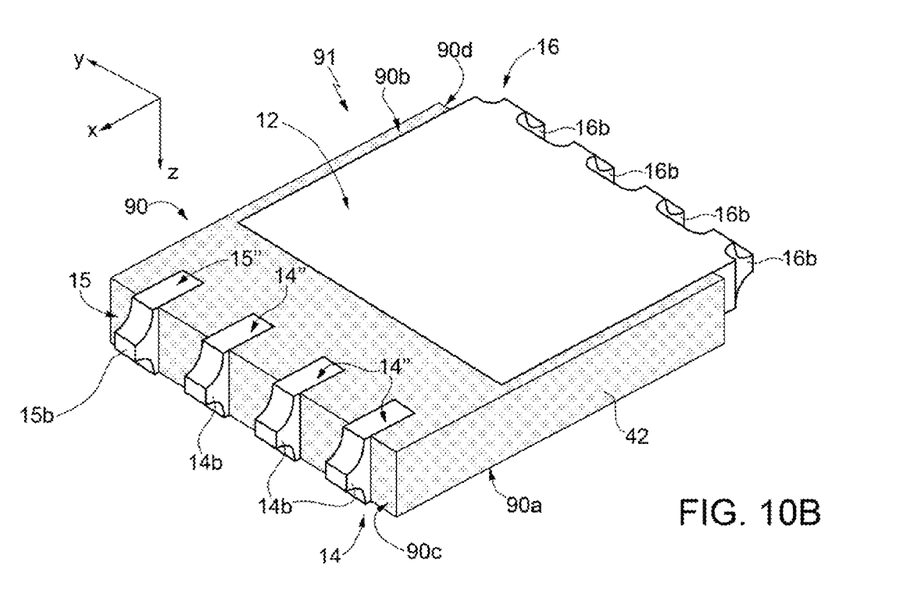

FIG. 10B shows the electronic device 91 of FIG. 10A rotated through 180° about the axis X for showing the bottom face 90b. Bottom surface portions 14", 15", and 16" of the fingers 14b, 15b, and 16b may be noted, which are electrically accessible from the bottom side 90b of the package 90. Further extending, and exposed, on the bottom side 90b of the package 90 is the bottom surface of the leadframe 12 (opposite, along Z, to the central region 13 on which the die 25 lies). In this way, the package 90 presents, both in the region corresponding to the top side 90a and in the region corresponding to the bottom side 90b, two conductive surfaces (in particular, metal conductive surfaces), in addition to the presence of the leads 14-16.

Figure 11A:
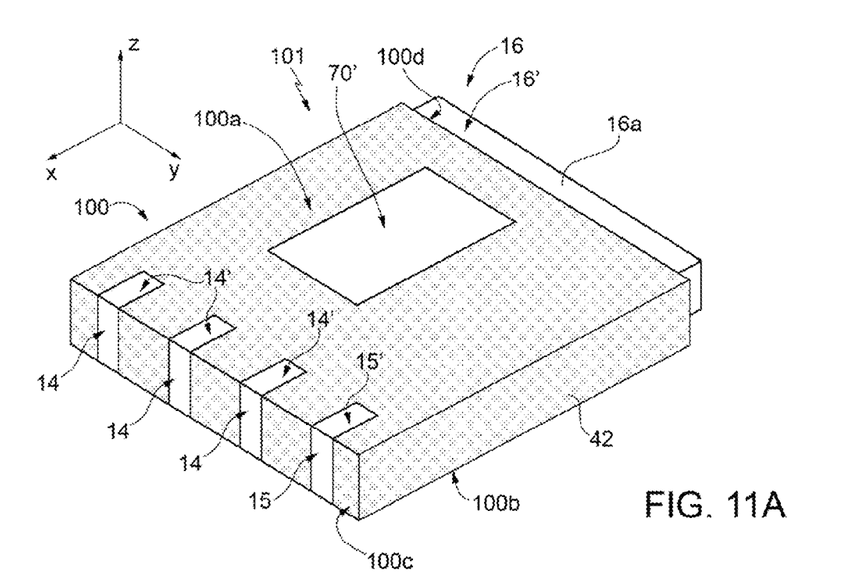
FIGS. 11A and 11B show respective views of an electronic device according to a further aspect of the present disclosure.
Figure 11B:
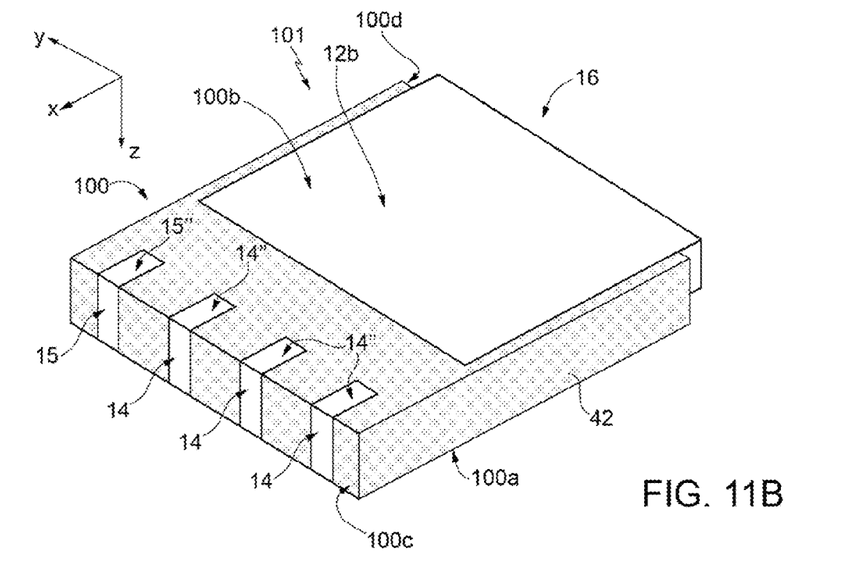

FIGS. 11A and 11B show respective top and bottom views of an electronic device 101, provided with a package 100, according to a further embodiment of the present disclosure.

The package 100 comprises a top side 100a, lying in a plane parallel to the plane XY, and a bottom side 100b, opposite to the top side 100a in the direction Z and lying in a respective plane parallel to the plane XY. The package 100 further comprises lateral surfaces, in particular a lateral surface 100c, lying in a plane parallel to the plane YZ, and a lateral surface 100d, which is opposite to the lateral surface 100c along X and lies in a respective plane parallel to the plane YZ.

In this case, leads 114-116 are present, shaped in such a way that, after the molding step, they do not project from the polymeric layer on the lateral surfaces 100c and 100d, but lie substantially in the same respective plane of lie as that of the lateral surfaces 100c and 100d (i.e., in a plane parallel to the plane YZ). The package 100 encapsulates an intermediate leadframe structure of the type illustrated in FIG. 8 and thus presents conductive regions electrically accessible from the top side 100a and bottom side 100b, in addition to the presence of the leads 114-116, which are also accessible both from the top side 100a and from the bottom side 100b.

The present disclosure, according to any one of the embodiments described previously, may be applied to numerous technical sectors. In particular, it is possible to install a heat exchanger on the exposed surface 70' of the conductive sheet 70 and/or on the exposed surface 12b of the leadframe 12.

Furthermore, with reference to FIGS. 4 and 10A-10B, since the leads 14-16 have an elongated shape, which protrudes in cantilever fashion from the package, they enable mounting of the package perpendicular to the plane of lie of the PCB, i.e., by inserting the leads 14-15, or alternatively 16, into holes purposely provided on the PCB.

From an examination of the characteristics of the disclosure obtained according to the present disclosure, the advantages that it affords are evident.

The possibility of accessing the pins of the package from both sides of the package itself allows the designer a greater flexibility in the design stages, for example in the development of circuits that are different and independent of one another for power supply of the die encapsulated in the package and for issuing signals for control thereof. There is further a minimization in the complexity of the printed circuit used for the testing steps (it is possible to access the die at the top, without any need to carry out bonding thereof with a testing PCB).

Furthermore, the performance in terms of thermal dissipation is optimized in so far as the surface for heat exchange is increased. This is all the more valid in the case of the embodiment of FIGS. 10A-10B and 11A-11B in so far as the conductive sheet 70 (exposed on the top side of the package and thus acting as heat exchanger) is in contact with the hottest part of the die 25, i.e., with the metallization that handles the power signals (with the source metallization, in the case of a transistor, in the proximity of the MOS junction at which most of the heat is generated).

Finally, it is clear that modifications and variations may be made to the disclosure described and illustrated herein, without thereby departing from the scope of the present disclosure.

For instance, the conductive sheet 70 may not be electrically coupled to the leads 14. In this case, in addition to the conductive sheet 70, likewise present is the ribbon 28 forming the electrical connection between the source region and the leads 14. The conductive sheet 70 extends over the die 25, in thermal contact therewith, and has exclusively the function of heat exchanger towards the outside of the package.

Furthermore, the conductive leads 16, coupled to the drain contact of the transistor, may be omitted. In this case, electric access to the drain contact is in any case possible from the bottom surface 12b of the leadframe 12.

Furthermore, during the molding steps illustrated in FIGS. 5A-5E, it is possible to insert a further molding film, similar to the molding film 56, also between the second mold 54 and the intermediate packaging structure 23, 73, so that both the leadframe 12 and the leads 14-16 rest on said further molding film and are better protected during the molding step.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device comprising:
   a semiconductor die integrating an electronic component and having a front side and a rear side that is opposite to the front side, the front side having a first access region that provides electric access to the electronic component, the rear side having a second access region that provides electric access to the electronic component;
   a leadframe structure including a supporting region that supports the semiconductor die, the rear side of the semiconductor die coupled to the supporting region;
   a protection body that laterally surrounds the semiconductor die and is over the first region of the semiconductor die and at least a portion of the leadframe structure, the protection body having atop surface, a bottom surface, a first lateral surface, a second lateral surface, and a thickness extending between the top surface and the bottom surface;
   a first conductive lead electrically coupled to the first access region, wherein said first conductive lead extends through the thickness of said protection body and forms a first front electrical contact exposed at the top surface, a first rear electrical contact exposed at the bottom surface, and a first lateral electrical contact exposed along the entire thickness at the first lateral surface; and
   a second conductive lead insulated from the first conductive lead and electrically coupled to the second access region, wherein said second conductive lead extends along the thickness of said protection body and forms a second front electrical contact exposed at the top surface, a second rear electrical contact exposed at the bottom surface, and a second lateral electrical contact exposed along the entire thickness of the second lateral surface.

2. The electronic device according to claim 1, further comprising a conductive sheet thermally coupled to the first access region, said conductive sheet being partially covered by the protection body with a portion of the conductive sheet being exposed by the protective body.

3. The electronic device according to claim 2, wherein said conductive sheet is further electrically coupled to the first access region of the die.

4. The electronic device according to claim 1, wherein the semiconductor die between said front side and said rear side of the semiconductor die has a third access region that provides electric access to the electronic component, the electronic device further comprising a third conductive lead electrically insulated from the first and second conductive leads and electrically coupled to the third access region,
wherein said third conductive lead extends along the first lateral surface through the thickness of said protection body and forms a respective third front electrical contact accessible at the top surface, a respective third rear electrical contact accessible at the bottom surface, and a respective third lateral electrical contact accessible along the first lateral surface.

5. The electronic device according to claim 4, wherein said electronic component is a MOS transistor, and said first, second, and third access regions are source, gate, and drain of a MOS transistor, respectively.

6. The electronic device according to claim 1, wherein the second access region extends to the rear side of said semiconductor die, wherein said leadframe structure is exposed at the bottom surface of said protection body and electrically coupled to the second access region.

7. The electronic device according to claim 1, wherein said first conductive lead includes a projecting conductive portion that is integral with the front electrical contact and the rear electrical contact, the projecting portion extending as a cantilever from the protection body.

8. The electronic device of claim 1, wherein the second lateral electrical contact protrudes from the second lateral surface.

9. The electronic device of claim 1, wherein the first lateral electrical contact protrudes from the first lateral surface and the second lateral electrical contact protrudes from the second lateral surface.

10. A semiconductor package comprising:
a semiconductor die integrating an electronic component;
a leadframe including a supporting region and a conductive lead, the semiconductor die coupled to the supporting region, the conductive lead having a first electrical contact surface, a second electrical contact surface opposite the first electrical contact surface, and a third electrical contact surface extending between the first and second electrical contact surfaces;
a conductive member electrically coupling the electrical component of the semiconductor die to the conductive lead; and
a protection body over the die and the supporting region of the leadframe and around a portion of lateral surfaces of the conductive lead, the protection body having a first surface, a second opposite surface, and a lateral surface, the conductive lead extending through the protection body from the first surface to the second surface, the first electrical contact surface of the conductive lead being exposed at the first surface of the protection body, the second electrical contact surface being exposed at the second surface of the protection body, and the third electrical contact surface being exposed along the entire thickness of the protection body at the lateral surface.

11. The semiconductor package according to claim 10, wherein the semiconductor die has an upper surface and an electric access region on the upper surface, wherein the conductive member has a first end coupled to the electric access region and a second end coupled to the first electrical contact surface of the conductive lead.

12. The semiconductor package according to claim 10, wherein the semiconductor die is electrically coupled to the supporting region of the leadframe.

13. The semiconductor package according to claim 10, wherein the conductive lead includes a cantilever portion between the first electrical contact surface and the second electrical contact surface that extends from a side surface of the protection body.

14. The semiconductor package according to claim 10, wherein the conductive member is one of a conductive sheet or a conductive ribbon.

15. The semiconductor package according to claim 10, wherein a lower surface of the supporting region remains exposed from the protection body.

* * * * *